(12) United States Patent
Lue et al.

(10) Patent No.: US 8,363,476 B2
(45) Date of Patent: Jan. 29, 2013

(54) MEMORY DEVICE, MANUFACTURING METHOD AND OPERATING METHOD OF THE SAME

(75) Inventors: Hang-Ting Lue, Hsinchu (TW); Shih-Hung Chen, Jhudong Township, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 192 days.

(21) Appl. No.: 13/009,464

(22) Filed: Jan. 19, 2011

(65) Prior Publication Data

US 2012/0182808 A1 Jul. 19, 2012

(51) Int. Cl.
*G11C 16/00* (2006.01)

(52) U.S. Cl. .. 365/185.18; 365/63; 365/72; 365/185.05; 365/185.17

(58) Field of Classification Search ............... 365/130
See application file for complete search history.

(56) References Cited

U.S. PATENT DOCUMENTS

| | | | |
|---|---|---|---|
| 7,414,889 B2 | 8/2008 | Lue et al. | |
| 7,800,163 B2 * | 9/2010 | Izumi et al. | 257/324 |
| 8,026,546 B2 * | 9/2011 | Murata et al. | 257/326 |
| 8,163,616 B2 * | 4/2012 | Kang et al. | 438/258 |
| 8,169,826 B2 * | 5/2012 | Hishida et al. | 365/185.11 |
| 2007/0284620 A1 | 12/2007 | Lue et al. | |
| 2010/0226195 A1 | 9/2010 | Lue | |

OTHER PUBLICATIONS

Lue, H.T., et al; "A Highly Scalable 8-Layer 3D Vertical-Gate (VG) TFT NAND Flash Using Junction-Free Buried Channel BE-SONOS Device;" IEEE Symposium on VLSI Technology Digest of Technical Papers; 2010; pp. 131-132.

\* cited by examiner

*Primary Examiner* — Tan T. Nguyen
(74) *Attorney, Agent, or Firm* — McClure, Qualey & Rodack, LLP

(57) ABSTRACT

A memory device, a manufacturing method and an operating method of the same are provided. The memory device includes a substrate, stacked structures, a channel element, a dielectric element, a source element, and a bit line. The stacked structures are disposed on the substrate. Each of the stacked structures includes a string selection line, a word line, a ground selection line and an insulating line. The string selection line, the word line and the ground selection line are separated from each other by the insulating line. The channel element is disposed between the stacked structures. The dielectric element is disposed between the channel element and the stacked structure. The source element is disposed between the upper surface of the substrate and the lower surface of the channel element. The bit line is disposed on the upper surface of the channel element.

26 Claims, 14 Drawing Sheets

MEMORY DEVICE, MANUFACTURING METHOD AND OPERATING METHOD OF THE SAME

BACKGROUND

1. Technical Field

The disclosure relates in general to a memory device, a manufacturing method and an operating method of the same and more particularly to a 3D vertical gate memory device, a manufacturing method and an operating method of the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, the scaling limitation of a memory cell size of this kind of the memory device is still bigger than 50 nm. It is not easy to breakthrough the limitation. The performance of the memory device may also be limited due to its element material.

SUMMARY

The disclosure is directed to a memory device, a manufacturing method and an operating method of the same. The memory device has a small scaling feature and good performance.

According to one aspect of the present disclosure, a memory device is provided. The memory device includes a substrate, stacked structures, a channel element, a dielectric element, a source element, and a bit line. The stacked structures are disposed on the substrate. Each of the stacked structures includes a string selection line, a word line, a ground selection line and an insulating line. The string selection line, the word line and the ground selection line are separated from each other by the insulating line. The channel element is disposed between the stacked structures. The dielectric element is disposed between the channel element and the stacked structure. The source element is disposed between the upper surface of the substrate and the lower surface of the channel element. The bit line is disposed on the upper surface of the channel element.

According to another aspect of the present disclosure, a method for manufacturing a memory device is provided. The method includes following steps. Stacked structures are disposed on the substrate. Each of the stacked structures includes a string selection line, a word line, a ground selection line and an insulating line. The string selection line, the word line and the ground selection line are separated from each other by the insulating line. A channel element is disposed between the stacked structures. A dielectric element is disposed between the channel element and the stacked structure. A source element is disposed between the upper surface of the substrate and the lower surface of the channel element. A bit line is disposed on the upper surface of the channel element.

According to yet another aspect of the present disclosure, a method for operating a memory device is provided. The method includes following steps. A memory device is provided. The memory device includes a substrate, stacked structures, a channel element, a dielectric element, a source element, and a bit line. The stacked structures are disposed on the substrate. Each of the stacked structures includes a string selection line, a word line, a ground selection line and an insulating line. The string selection line, the word line and the ground selection line are separated from each other by the insulating line. The channel element includes channel lines. The channel lines are disposed between the stacked structures and separated from each other. The dielectric element is disposed between the channel lines and the stacked structures. The source element is disposed between the upper surface of the substrate and the lower surface of the channel lines. The bit line is disposed on the upper surface of the channel element. At least one of the channel lines is selected to be turned on.

The above and other aspects of the disclosure will become better understood with regard to the following detailed description of the non-limiting embodiment(s). The following description is made with reference to the accompanying drawings.

DETAILED DESCRIPTION

Figure 1:
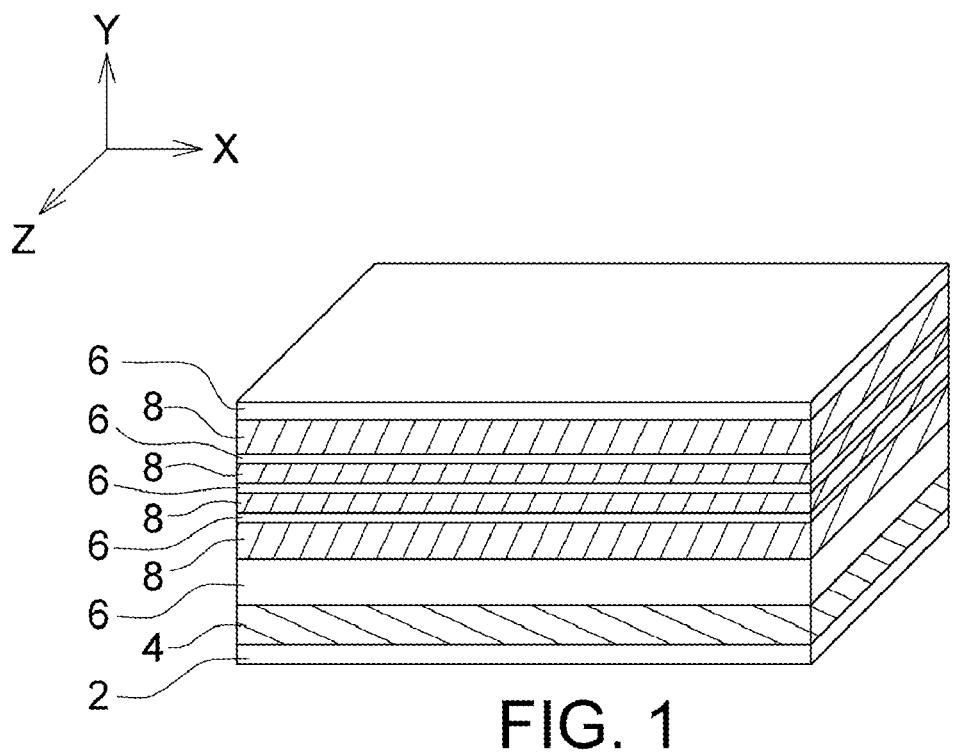
FIGS. 1-13 illustrate a method for manufacturing a memory device in one embodiment.

FIGS. 1-13 illustrate a method for manufacturing a memory device in one embodiment. Referring to FIG. 1, a source element 4 is disposed on a substrate 2. In embodiments, the source element 4 may comprise a source layer or a source line. The embodiment as shown in FIGS. 1-13 is illustrated by using the source element 4 being the source layer covering the substrate 2. The source element 4 may have N+ type conductivity. In one embodiment, the source element 4 is disposed on and insulated from the substrate 2. For example, the source element 4 and the substrate 2 are separated from each other by a dielectric structure (not shown). Sacrificial layers 6 and insulating layers 8 are alternately stacked on the source element 4. The sacrificial layers 6 are separated from each other by the insulating layers 8. The sacrificial layer 6 may comprises a nitride such as silicon nitride. The insulating layer 8 may comprise an oxide such as silicon oxide. The most bottom one of the insulating layers 8 may be a buried oxide layer.

Figure 2:
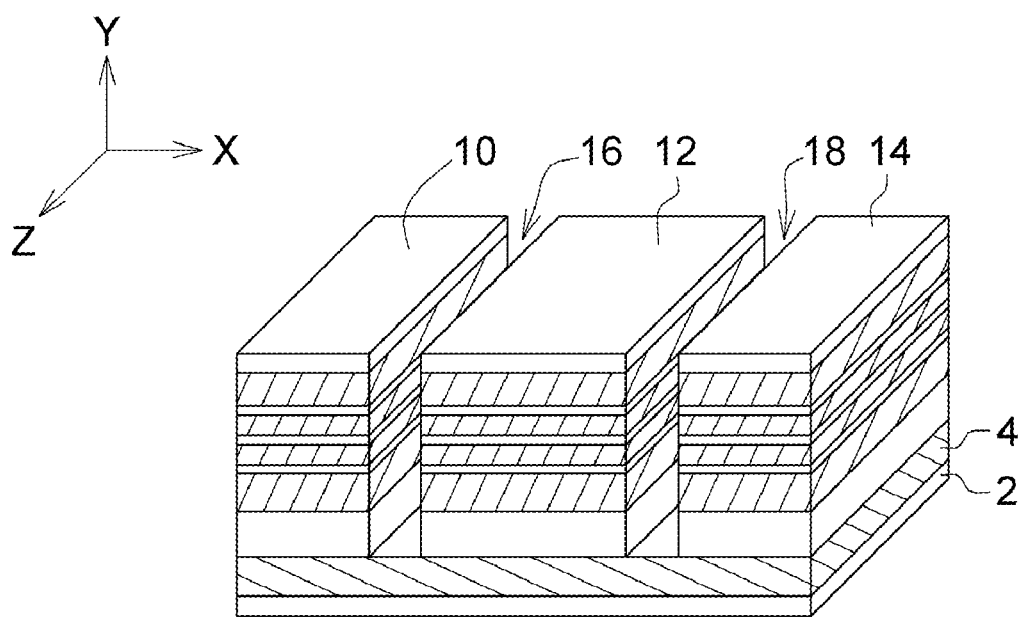
Figure 3:
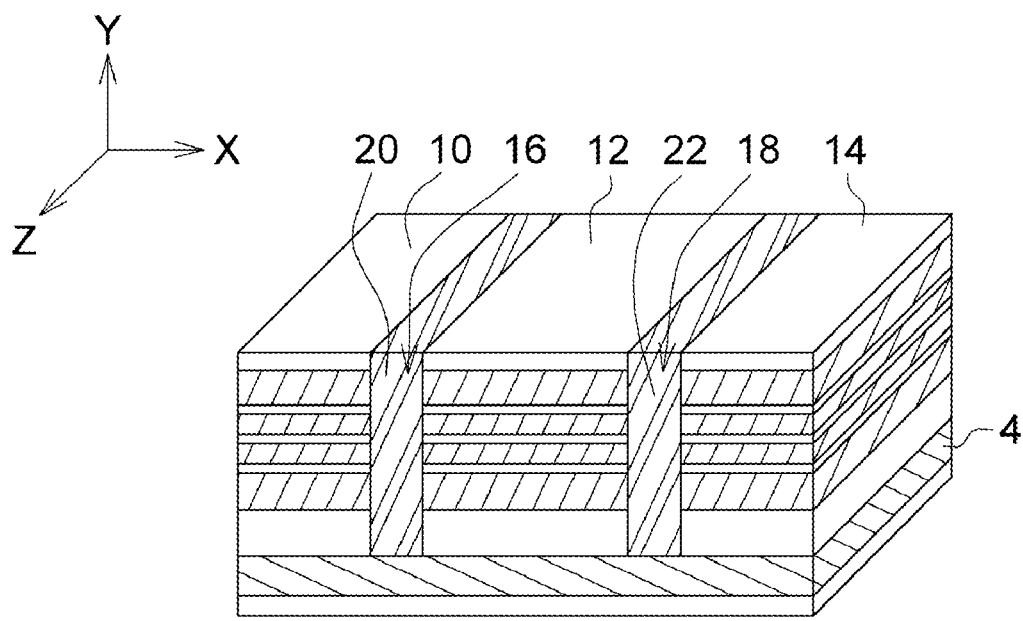

The sacrificial layers 6 and the insulating layers 8 are patterned for forming patterned structures 10, 12, 14 as shown in FIG. 2. The source element 4 is exposed by first openings 16, 18. Referring to FIG. 3, a conductive material is disposed in the first openings 16, 18 for forming channel elements 20, 22. In embodiments, the source element 4 has a single crystal material, and the channel elements 20, 22 have a single crystal material formed by a selective epitaxial growth from and on the source element 4. In one embodiment, the source element 4 and the channel elements 20, 22 are composed of single crystal silicon. Before the epitaxial growth, a cleaning process may be performed for removing native oxide on the source element 4 for fine quality for the channel elements 20, 22.

Figure 4:
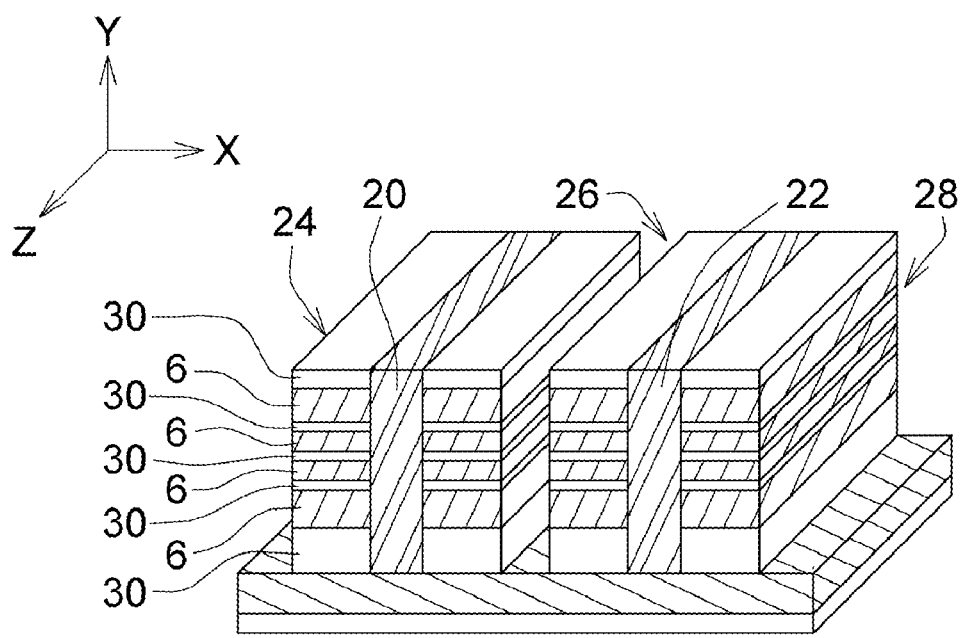
Figure 5:
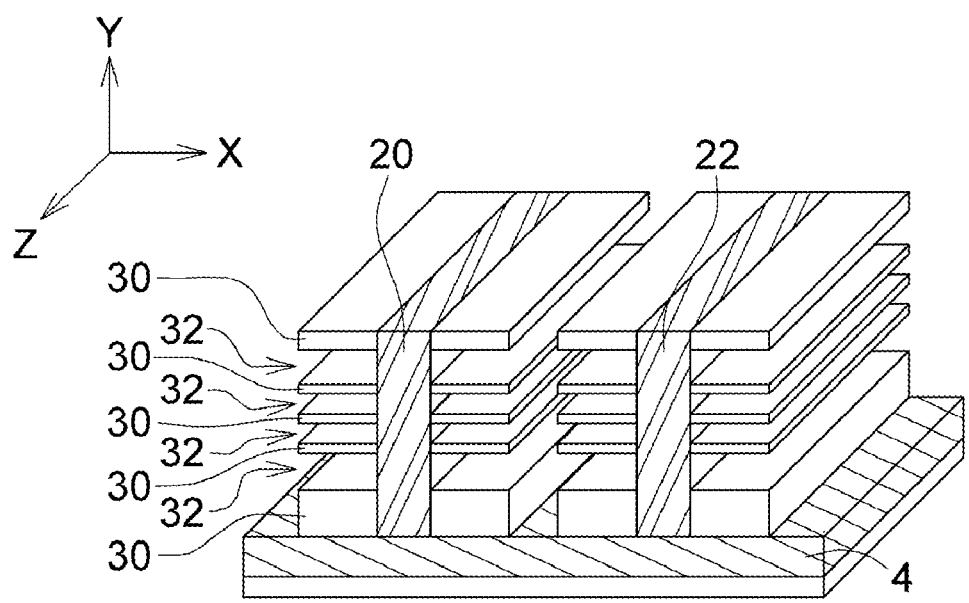
Figure 6:
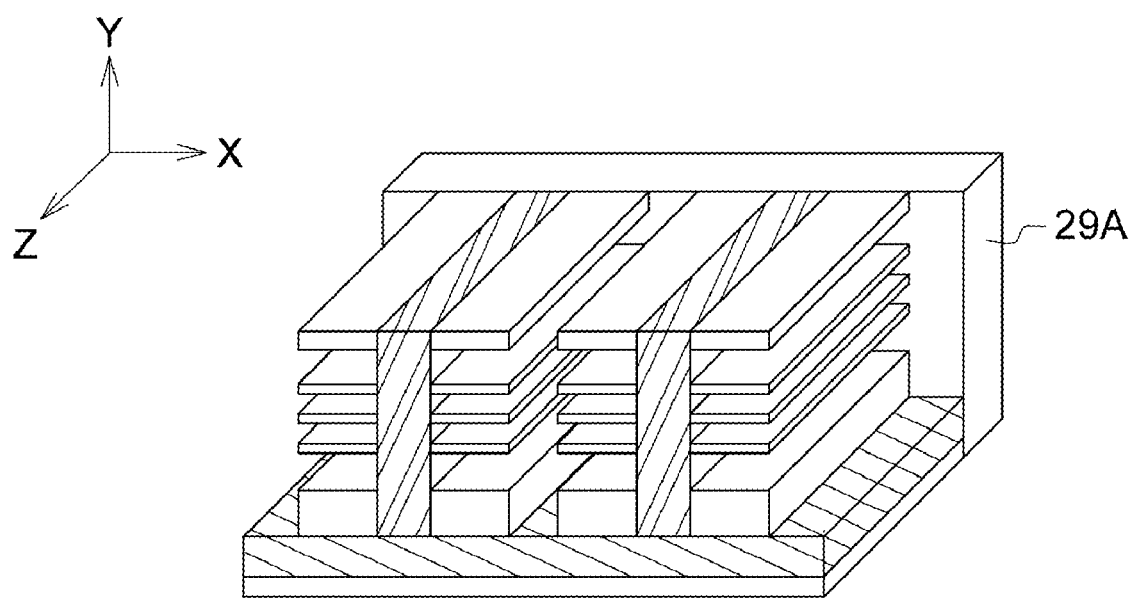
Figure 7:
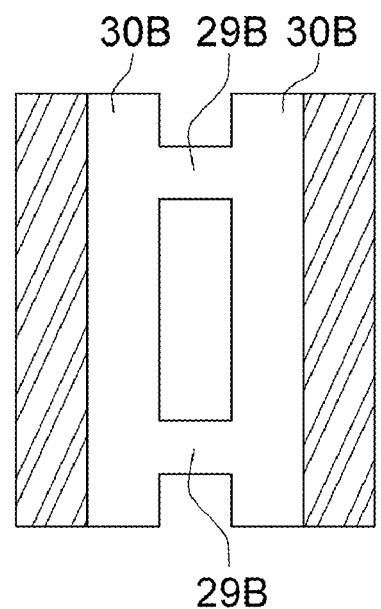

The patterned structures 10, 12, 14 are patterned for forming second openings 24, 26, 28 and insulating lines 30 as shown in FIG. 4. The sacrificial layers 6 exposed by the second openings 24, 26, 28 are removed for forming slits 32 exposing the channel elements 20-22 as shown in FIG. 5. In one embodiment, the sacrificial layers 6 (for example, silicon nitride) are removed by using a hot H3PO4. The etching process has a high selectivity. Thus, the source element 4 (for example, single crystal silicon) and the insulating lines 30 (for example, oxide) would not be damaged during the etching process. In one embodiment, there is enough strength for maintaining the oxide insulating lines 30 as shown in FIG. 5 since the structure is adjoined to a sidewall of a holder structure (for example, the holder structure 29A such as a oxide as shown in FIG. 6). Referring to FIG. 7, which illustrates a top view of the memory device in some embodiments, the periodically surrounded oxide holder structures 29B helps to suspend the oxide insulating lines 30B.

Figure 8:
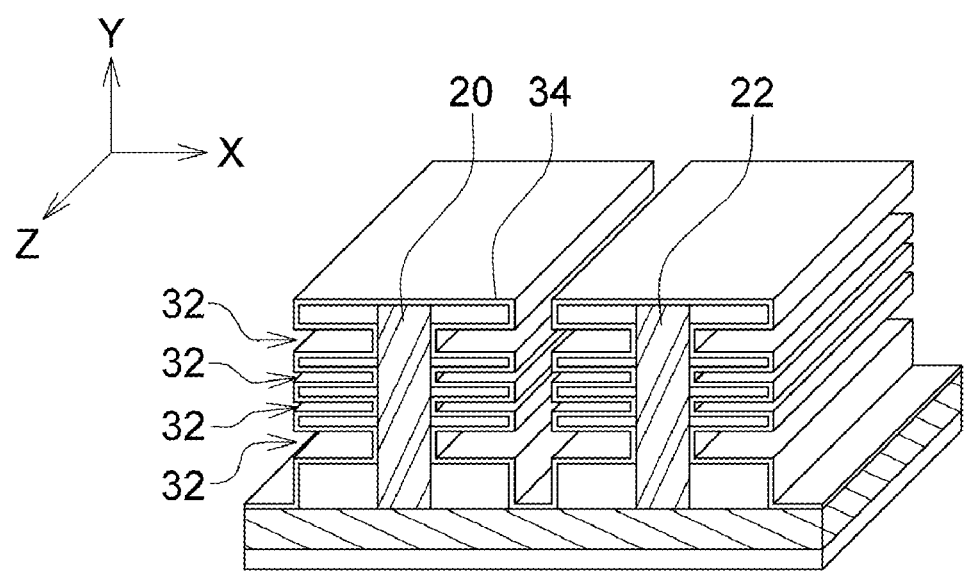
Figure 9:
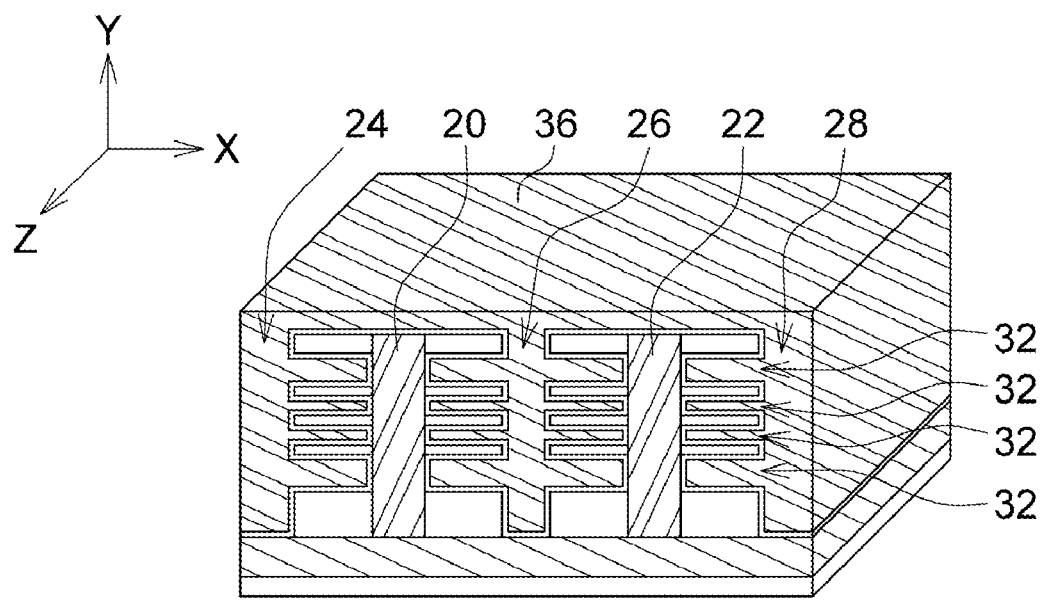

Referring to FIG. 8, a dielectric element 34 is formed on the channel elements 20, 22 exposed by the slits 32. For example, in embodiments, the dielectric element 34 may have a multi-layer structure, for example, which may be an ONO composite layers, an ONONO composite layers, or a BE-SONOS composite layers (referring to U.S. Ser. No. 11/419,977 or U.S. Pat. No. 7,414,889), or comprise, for example, an ONO structure formed by alternately stacking silicon oxide and silicon nitride. The dielectric element 34 may also be a single material layer, comprising silicon nitride, or silicon oxide such as silicon dioxide, silicon oxynitride. The dielectric element 34 may be formed by a vapor deposition method such as chemical vapor deposition method. Referring to FIG. 9, a conductive material 36 is filled in the slits 32. In addition, the conductive material 36 is also filled in the second openings 24, 26, 28. The conductive material 36 may be extended on the channel elements 20, 22.

Figure 10:
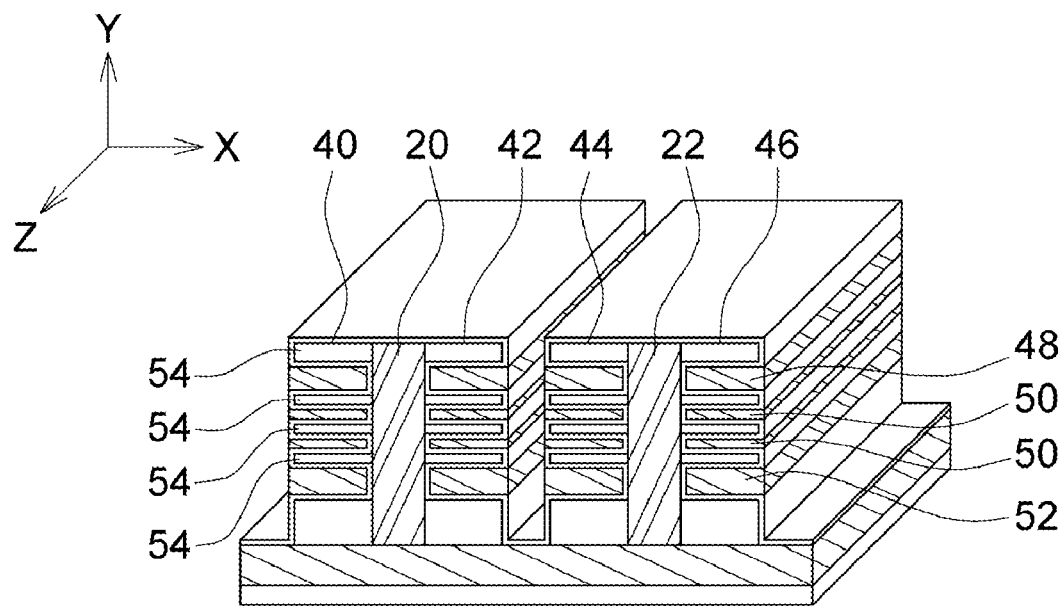
Figure 11:
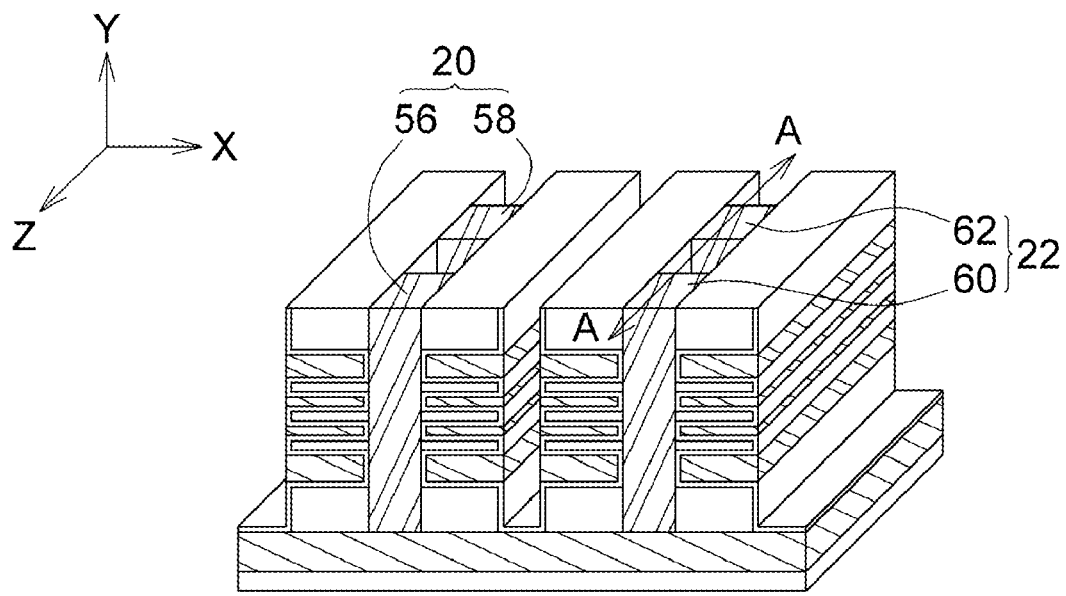
Figure 12:
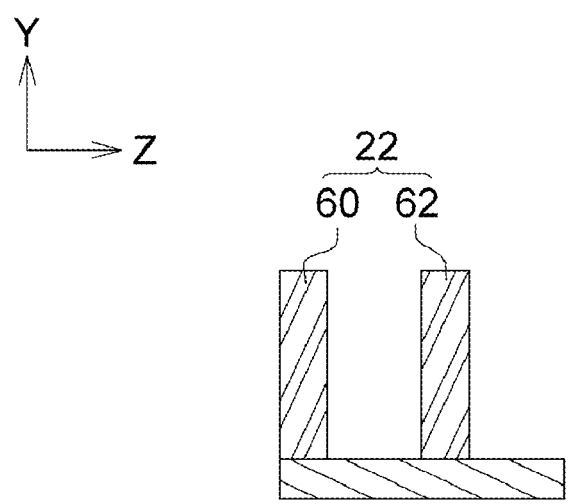

A part of the conductive material 36 in second openings 24, 26, 28 are removed, remaining a part of the conductive material 36 filling the slits 32 for forming stacked structures 40, 42, 44, 46 as shown in FIG. 10. Referring to FIG. 10, each of the stacked structures 40, 42, 44, 46 comprises, for example, a string selection line (SSL) 48, word lines (WL) 50, a ground selection line (GSL) 52 and insulating lines 54. The string selection line 48, the word lines 50, the ground selection line 52 are separated from each other by the insulating lines 54. The channel element 20 and the channel element 22 after being patterned have respectively channel lines 56, 58 and channel lines 60, 62 as shown in FIG. 11. The channel lines 56 and 58 are separated from each other. Similarly, channel lines 60 and 62 are separated from each other, as shown in FIG. 12, a cross-sectional view along AA line of FIG. 11.

Figure 13:
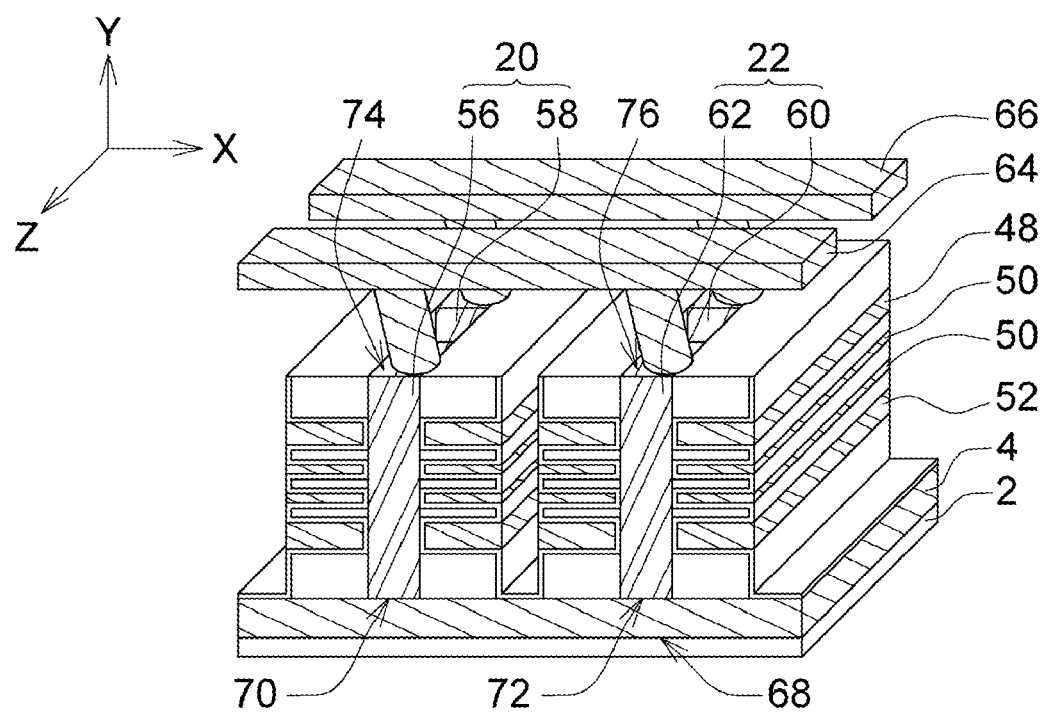

Referring to FIG. 13, bit lines 64, 66 are formed on the channel lines 56, 58, 60, 62. In the memory device shown in FIG. 13, the string selection lines 48, the word lines 50, the ground selection lines 54, and the bit lines 64, 66 may comprise a semiconductor material such as polysilicon. The string selection lines 48, the word lines 50, the ground selection lines 54, and the bit lines 64, 66 may also comprise a metal such as tungsten for reducing resistance. The source element 4 (in this embodiment, being the source layer covering the substrate 2) is disposed between the upper surface 68 of the substrate 2 and the lower surfaces 70, 72 of the channel elements 20, 22 (comprising, for example, the channel lines 56, 58, 60, 62). The bit lines 64, 66 are disposed on the upper surface 74, 76 of the channel elements 20, 22 (comprising, for example, the channel lines 56, 58, 60, 62). In one embodiment, the channel elements 20, 22 and the source element 4 are composed of single crystal silicon, and thus have good conductive characteristics and low resistance therebetween.

Figure 14:
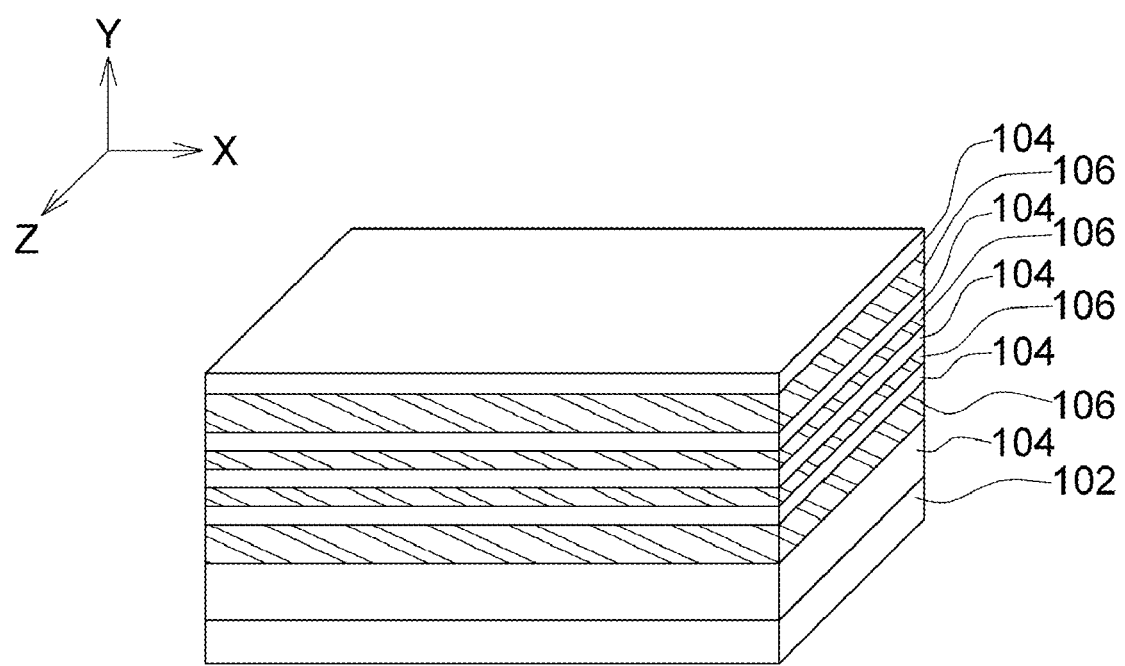
FIGS. 14-19 illustrate a method for manufacturing a memory device in other embodiments.
Figure 15:
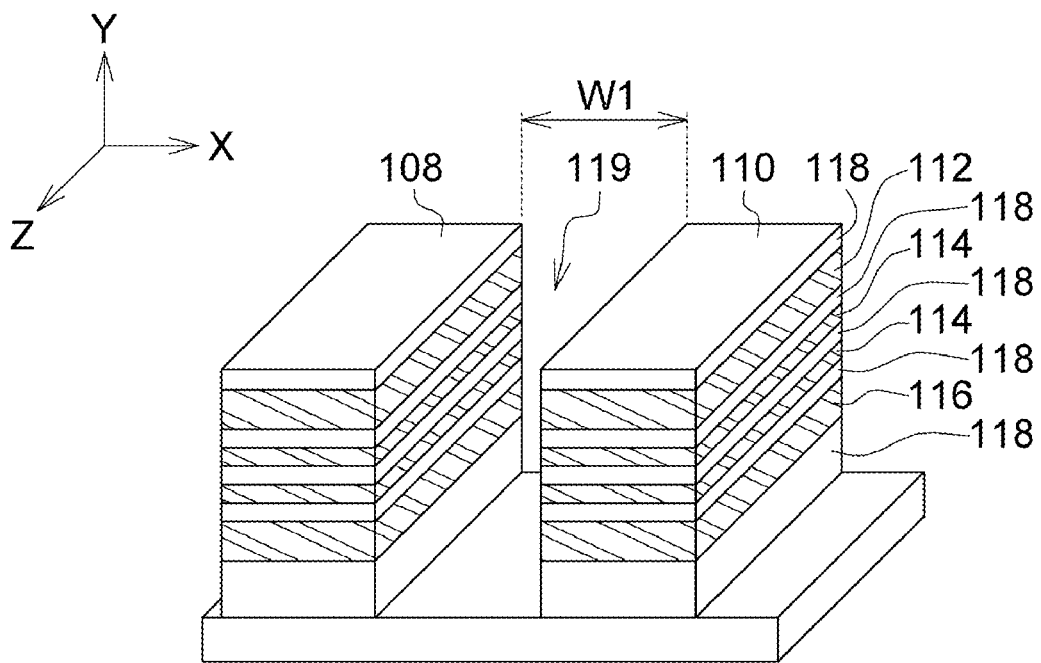

FIGS. 14-19 illustrate a method for manufacturing a memory device in other embodiments. Referring to FIG. 14, insulating layers 104 and conductive layers 106 are alternately stacked on the substrate 102. The insulating layers 104 may comprise an oxide such as silicon oxide. The most bottom one of the insulating layers 104 may be a buried oxide layer. The conductive layers 106 may comprise a metal or a semiconductor material such as polysilicon. In embodiments, the conductive layers 106 may be formed by forming a polysilicon layer and then doping the layer (with, for example, a P type dopant for high work function and suppressed gate injection). The conductive layers 106 are separated from each other by the insulating layers 104. The conductive layers 106 and the insulating layers 104 are patterned for forming stacked structures 108, 110 as shown in FIG. 15. Referring to FIG. 15, each of the stacked structures 108, 110 comprises, for example, a string selection line 112, word lines 114, a ground selection line 116, and insulating lines 118. The string selection line 112, the word lines 114, and the ground selection line 116 are separated from each other by the insulating lines 118. The stacked structure 108 and the stacked structure 110 have a space 119 therebetween. In one embodiment, the space 119 has a width W1 bigger than 60 nm.

Figure 16:
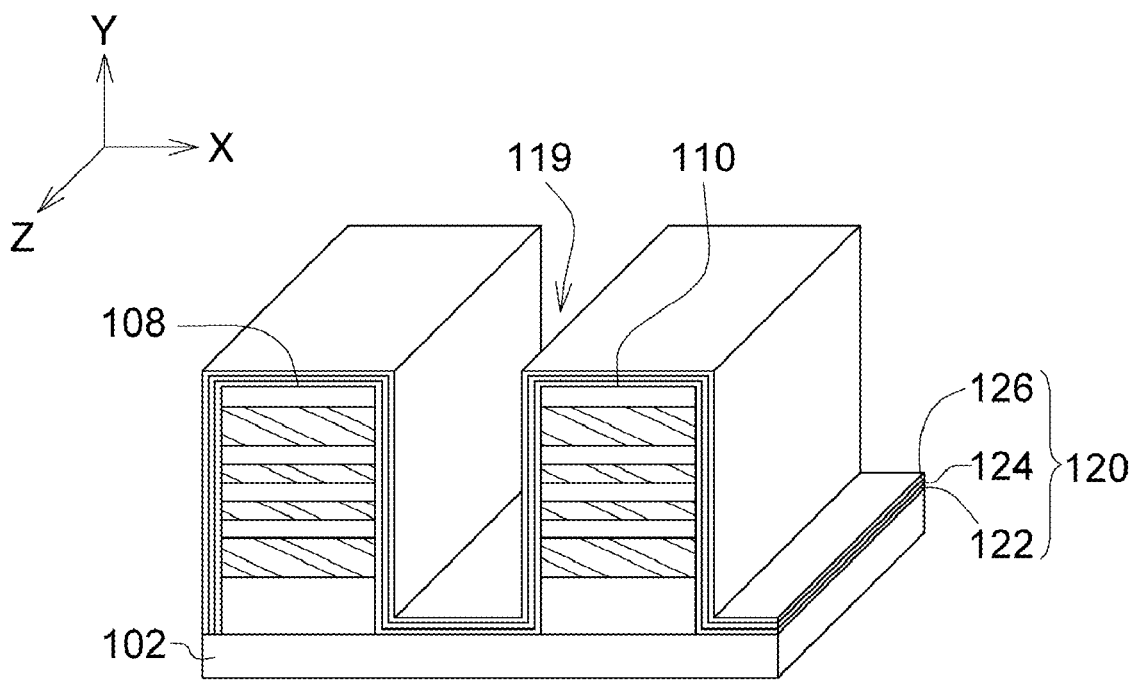

Referring to FIG. 16, a dielectric element 120 is formed on the substrate 102 and the stacked structures 108, 110 exposed by the space 119. For example, the dielectric element 120 has a multi-layer structure such as an ONO composite layers, an ONONO composite layers, or a BE-SONOS composite layers (referring to U.S. Ser. No. 11/419,977 or U.S. Pat. No. 7,414,889). In one embodiment, the dielectric element 120 is an ONO structure in which a dielectric layer 122 is silicon oxide, a dielectric layer 124 is silicon nitride, and a dielectric layer 126 is silicon oxide. In other embodiments, the dielectric element 120 is a single material layer (not shown), comprising silicon nitride, or silicon oxide such as silicon dioxide, silicon oxynitride.

Figure 17:
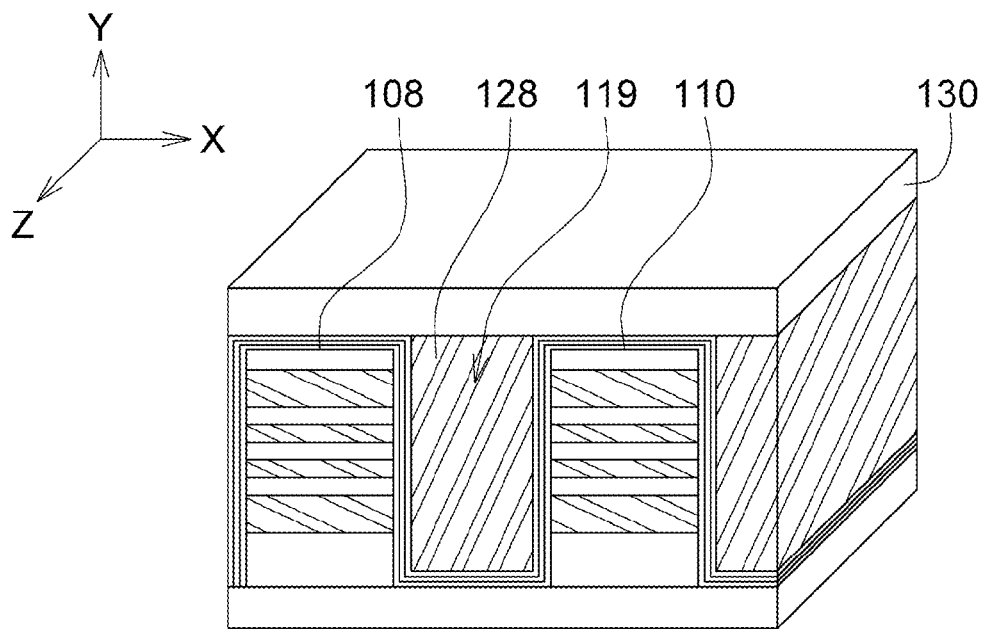
Figure 18:
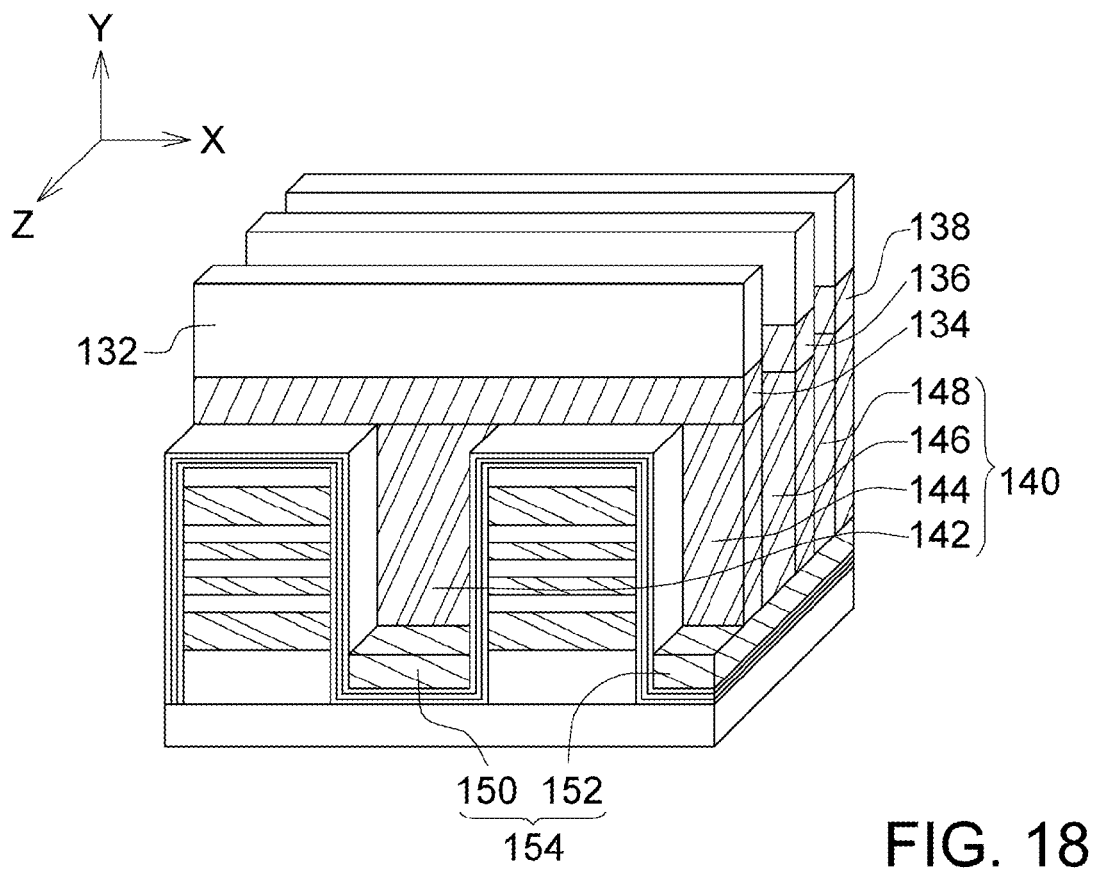

Referring to FIG. 17, the space 119 is filled with a conductive material 128. The conductive material 128 may be extended on the stacked structures 108, 110. In one embodiment, a portion of the conductive material 128 (such as polysilicon) extended on the stacked structures 108, 110 is doped (for example, with an N type dopant) for forming a doped (for example, N+ type conductivity) conductive material 130. A patterned mask layer 132 is formed on the doped conductive material 130, and a portion of the doped conductive material 130 not covered by the mask layer 132 is removed for forming, for example, bit lines 134, 136, 138 as shown in FIG. 18. In addition, an upper portion of the conductive material 128 not covered by the mask layer 132 is removed for forming a channel element 140, for example, comprising channel lines 142, 144, 146, 148. The remaining bottom portion of the conductive material 128 forms a source element 154, comprising, for example, source lines 150, 152 as shown in FIG. 18. The mask layer 132 for forming a memory device as shown in FIG. 19.

Figure 19:
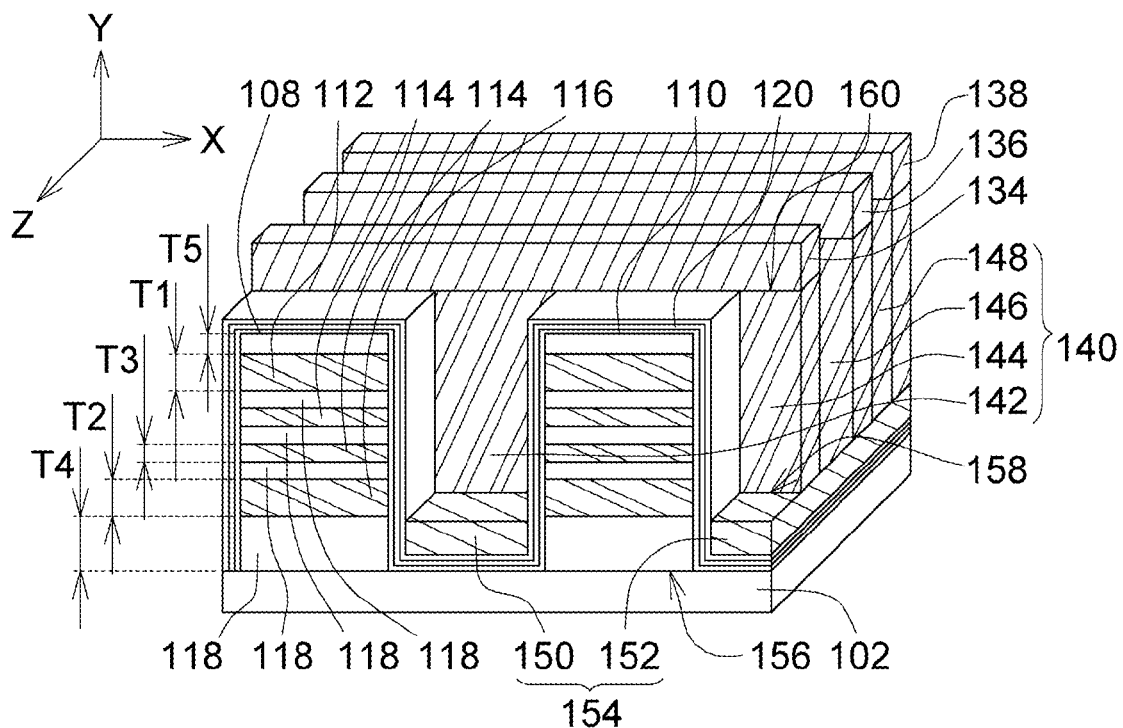

Referring to FIG. 19, the source element 154, comprising source lines 150, 152, is disposed between the upper surface 156 of the substrate 102 and the lower surface 158 of the channel element 140 comprising, for example, the channel lines 142, 144, 146, 148. The bit lines 134, 136, 138 are disposed on the upper surface 160 of the channel element 140. The source element 154 and the substrate 102 are separated from each other by the dielectric element 120. The substrate 102 may be used as a bottom gate for reducing resistance of the source element 154. For example, the source line 152 of the source element 154 below the channel lines 144, 146, 148 on the same sidewall of the stacked structure 110 and separated from each other is single or continuously extended. For example, the source line 150 and the source line 152 respectively below the channel line 142 and the channel line 144 on the opposite sidewalls of the stacked structure 110 are separated from each other. The channel lines 142, 144, 146, 148 have a long side (extended in Y direction) perpendicular to a long side (extended in Z direction) that the source lines 150, 152 have.

Referring to FIG. 19, in one embodiment, the string selection lines 112, the word lines 114, and the ground selection lines 116 have a first type conductivity (such as P type); the bit lines 134, 136, 138, the source element 154 (comprising the source lines 150, 152) and the channel element 140 (comprising the channel lines 142, 144, 146, 148) have a second type conductivity (such as N type) opposite to the first type conductivity. In embodiments, the channel element 140 has a dopant concentration smaller than a dopant concentration that the source element 154 has. The dopant concentration of the channel element 140 may also be smaller than a dopant concentration that the bit lines 134, 136, 138 have. In some embodiments, the bit lines 134, 136, 138 and the channel element 140 have opposite the first type conductivity and the second type conductivity respectively, and form a PN diode.

Referring to FIG. 19, in some embodiments, the string selection lines 112, the word lines 114, and the ground selection lines 116 are all P+ type. The string selection lines 112, the word lines 114, and the ground selection lines 116 may also all be N− type. In one embodiment, the string selection lines 112 and the word lines 114 are all N− type, and the ground selection lines 116 are N+ type. In other embodiments, the string selection line 112 is P type, the ground selection line 116 is N+ type, one of the word lines 114 adjacent to the string selection lines 112 is N type, and another one of the word lines 114 adjacent to the ground selection line 116 is P type.

Referring to FIG. 19, in one embodiment, the string selection line 112 and the ground selection line 116 respectively have a big thickness T1 and a big thickness T2 (i.e. corresponding channel length), equal to, usually bigger than a thickness T3 that the word line 114 has, for excellent switching, low leakage, and high punch-through capability. In one embodiment, the thickness T1 and the thickness T2 are 2000 Å. The thickness T3 is 300 Å. The thickness T4 of the most bottom of the insulating lines 118 may be 2000 Å. The thickness T5 of the others of the insulating lines 118 may be 300 Å.

Referring to FIG. 19, the memory device is a 3D vertical gate memory device, for example, comprising a NAND flash memory and a anti-fuse memory, etc. The memory device has the architecture scalable below 30 nm (half pitch) in both X and Y direction. Therefore, the memory device has a high element density.

Figure 20:
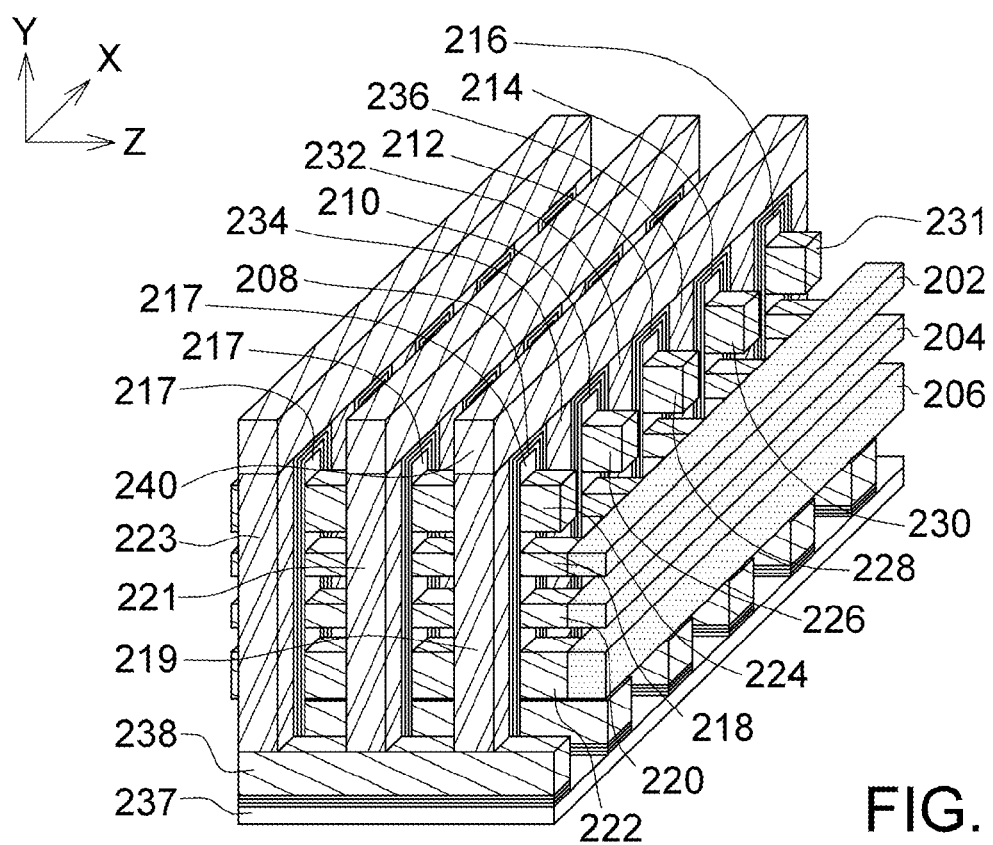
FIG. 20 is a three dimensional view of a memory device in one embodiment.

FIG. 20 is a three dimensional view of a memory device in one embodiment. FIG. 20 does not shown a portion of the insulating line 217 between the channel lines 219, 221, 223. Namely, the insulating line 217 should be as continuous as the string selection lines 224, 226, 228, 230, the word lines 218, 220 and the ground selection lines 222. Referring to FIG. 20, for example, in one embodiment, the string selection lines 224, 226, 228, 230, the word lines 218, 220, and the ground selection lines 222 have P+ type conductivity; the source elements 238 and the bit lines 240 have N+ type conductivity; and the channel lines 219, 221, 223, 232, 234, 236 have N type conductivity. A method for operating the memory device comprises applying bias voltages to the word lines 218, 220 and the ground selection lines 222 of the stacked structures 208, 210, 212, 214, 216 by common contact structures 202, 204, 206. For example, a bias voltage $V_{PGM}$ or $V_{READ}$ is applied to the word lines 218. A bias voltage VPASS is applied to the word lines 220. In addition, a zero voltage (for PGM) is applied to the ground selection lines 222. Alternatively, a bias voltage $V_{cc}$ (for read) is applied to the ground selection lines 222. Therefore, recoding for the word lines 218, 220 is easy. In this embodiment, the string selection lines 224, 226, 228, and 230 are separately decoded. The selected channel line 232 is turned on by applying a positive bias voltage ($+V_{cc}$, such as +3.3 V) to the string selection lines 226, 228 of the stacked structures 210, 212 on the two opposite sidewalls of the selected channel line 232. In order to avoid disturbing to the adjacent unselected channel lines 234, 236, a negative bias voltage ($-V_{cc}$, such as −3.3 V) may be applied to the string selection lines 224, 230 of the stacked structures 208, 214 on one sidewall of the channel lines 234, 236 to turn off the adjacent SSL transistor. A far string selection line 231 could be applied a zero voltage or grounded simply. During reading, a positive bias voltage (for example, $+V_{cc}$ such as +5V) may be applied to the substrate 237 used as the bottom gate for reducing the resistance of the source elements 238.

Figure 21:
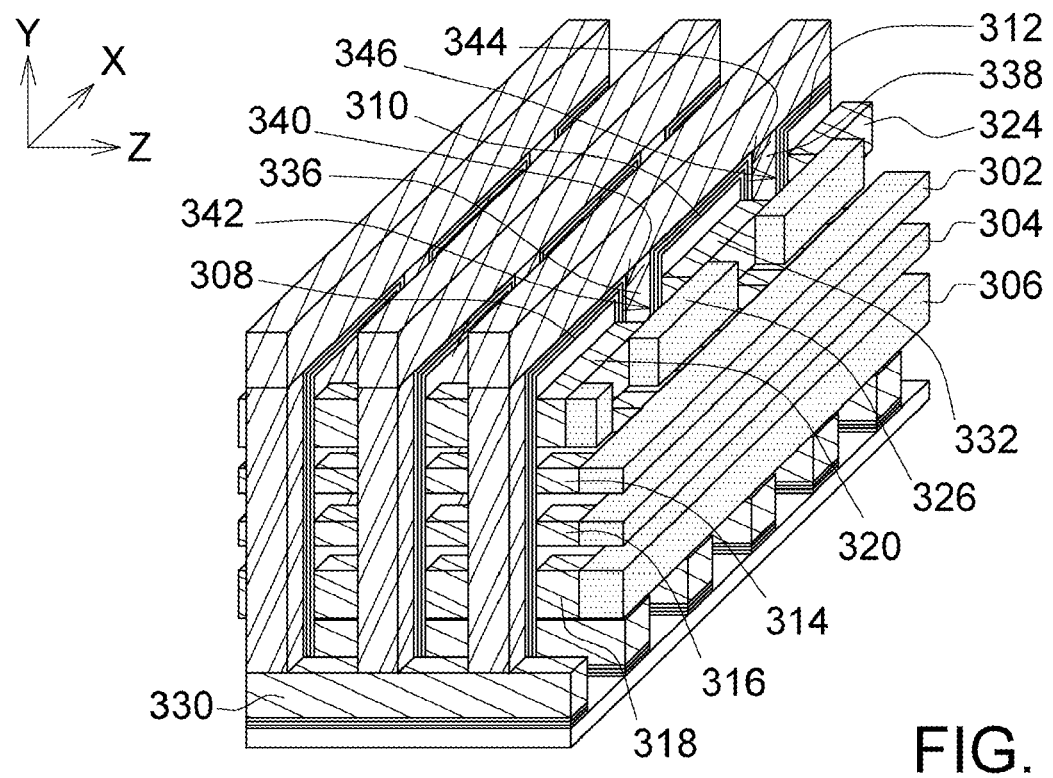
FIG. 21 is a three dimensional view of a memory device in one embodiment.

FIG. 21 is a three dimensional view of a memory device in one embodiment. The conductivity types of the elements of the memory device of FIG. 21 are similar with the conductivity types of the elements of the memory device of FIG. 20. Therefore, it is described again in detail. Referring to FIG. 21, a method for operating the memory device comprises applying bias voltages to the word lines 314, 316 and the ground selection lines 318 of the stacked structures 308 310, 312 by common contact structures 302, 304, 306. For example, a bias voltage $V_{PGM}$ or $V_{READ}$ is applied to the word lines 314. A bias voltage VPASS is applied to word lines 136. In addition, a zero voltage is applied to the ground selection lines 318 (for PGM). Alternatively, a bias voltage $V_{cc}$ is applied to the ground selection lines 318 (for read). The selected channel line 336 is turned on by applying a positive bias voltage (such as +3.3 V) to the string selection lines 320, 322 of the stacked structures 308, 310 on the two opposite sidewalls 340, 342 of the selected channel line 336 through the contact structure 326. For example, the string selection lines 322, 324 of the stacked structures 310, 312 on the two opposite sidewalls 344, 346 of the unselected channel lines 338 to be turned off are applied a zero voltage or grounded. The positive bias voltage for turn-on and the zero voltage for turn-off are respectively applied to a portion adjacent to the turned-on channel line 336 and a portion adjacent to the turned-off channel lines 338 of the single string selection line 322.

Figure 22:
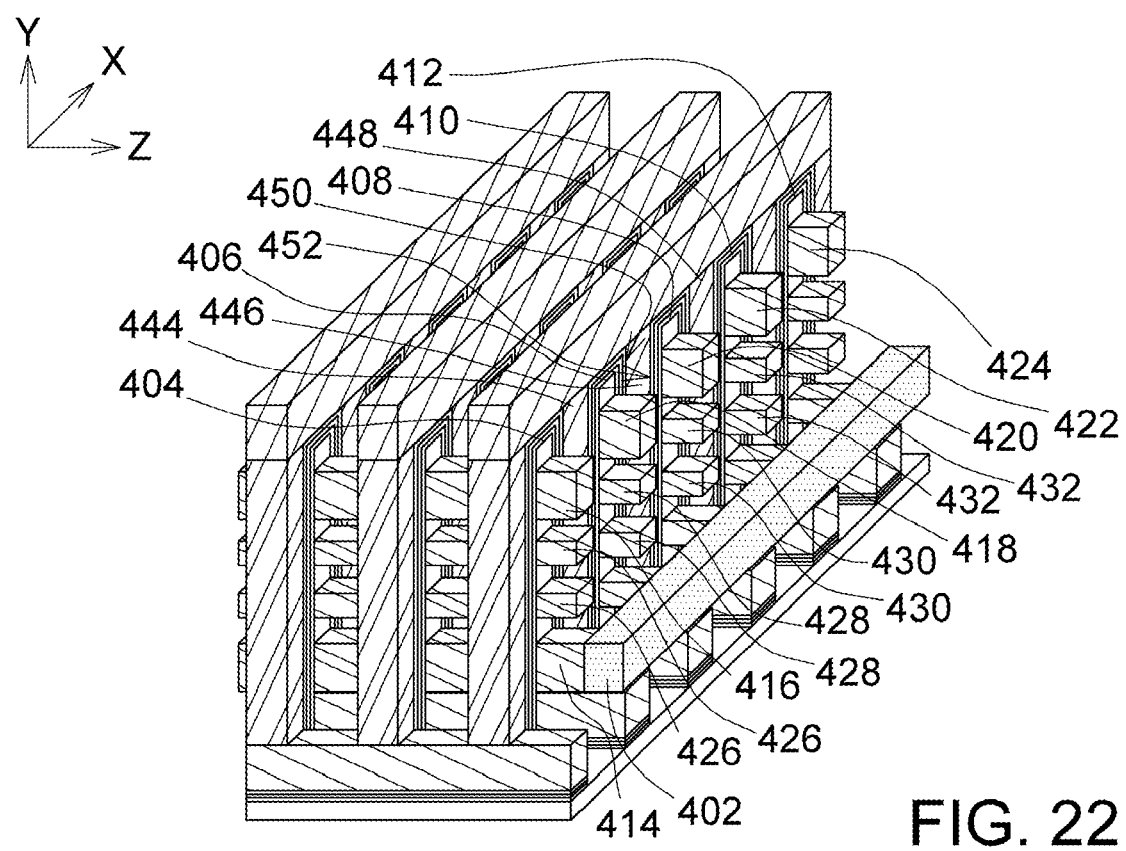
FIG. 22 is a three dimensional view of a memory device in one embodiment.

FIG. 22 is a three dimensional view of a memory device in one embodiment. The conductivity types of the elements of the memory device of FIG. 22 are similar with the conductivity types of the elements of the memory device of FIG. 20. Therefore, it is described again in detail. Referring to FIG. 22, a method for operating the memory device comprises applying bias voltages to the ground selection lines 414 of the stacked structures 404, 406, 408, 410, 412 by a common contact structure 402. In one embodiment, the word lines 426, 428, 430, 432 are divided into, for example, an odd group of the word lines 428, 432 and an even group of the word lines 426, 430. The different groups are applied voltages separately. For example, a $V_{READ}$ or $V_{PGM}$ is applied to the odd group of the word lines 428, 432. The even group of the word lines 426, 430 is applied with a zero voltage or grounded. In one embodiment, a positive bias voltage (such as +3.3 V) is applied to the ground selection lines 414. The selected channel line 446 is turned on by applying a positive bias voltage (such as +3.3 V) to the string selection lines 418, 420 of the stacked structures 406, 408 on the two opposite sidewalls 450, 452 of the channel line 446. A $V_{READ}$ or $V_{PGM}$ is applied to the word line 428 of the stacked structure 406. A zero voltage is applied to the word line 430 of the stacked structure 408. Therefore, only one ONONO structure on the sidewall 450 is selected to be programmed or read so that physically two-bit/cell can be achieved. A negative bias voltage (such as −3.3 V) may be applied to the string selection lines 416, 422 of the stacked structures 404, 410 on one sidewall of the unselected channel lines 444, 448. A far string selection line 424 could be applied a zero voltage or grounded.

Figure 23:
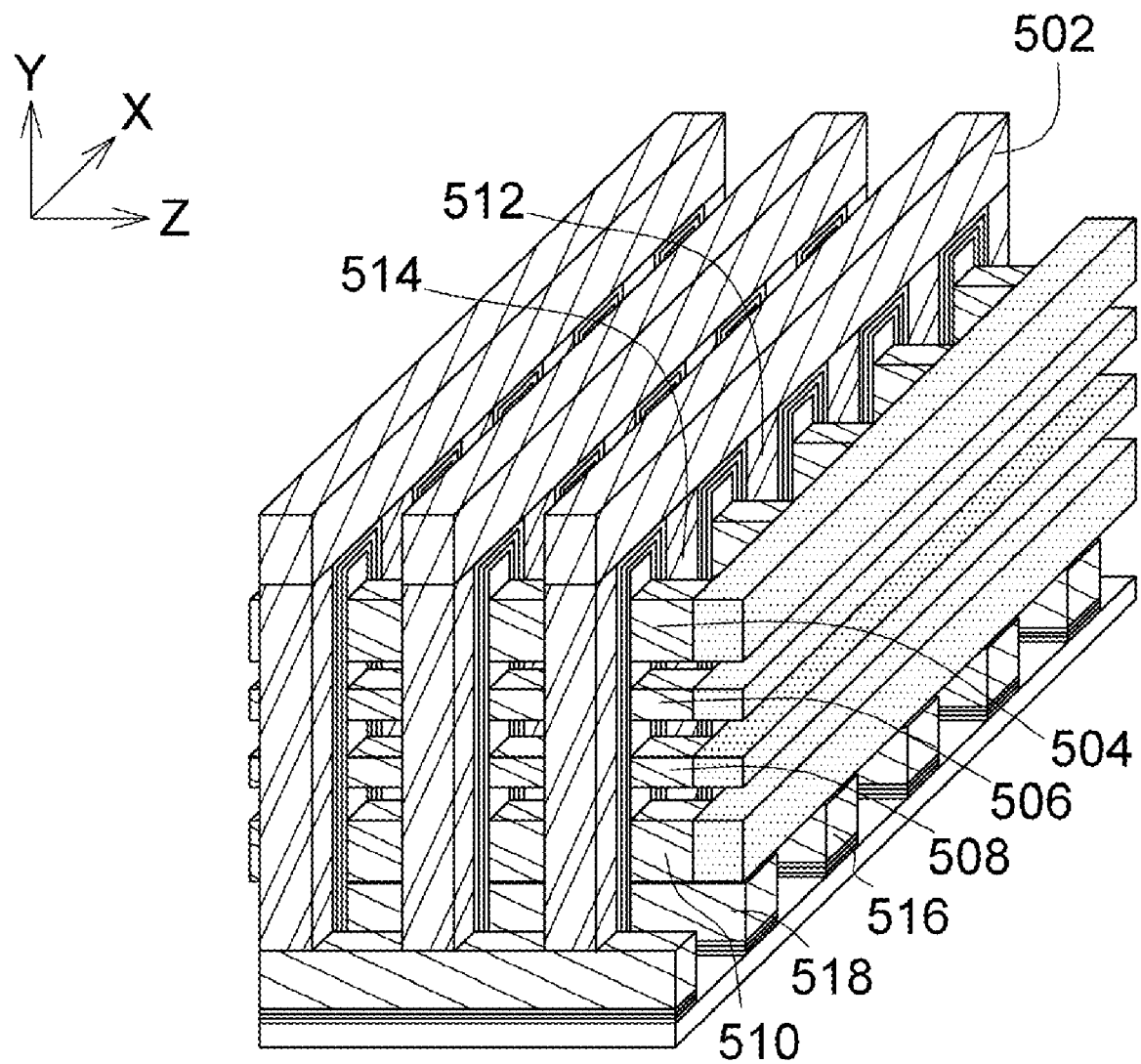
FIG. 23 is a three dimensional view of a memory device in one embodiment.
Figure 24:
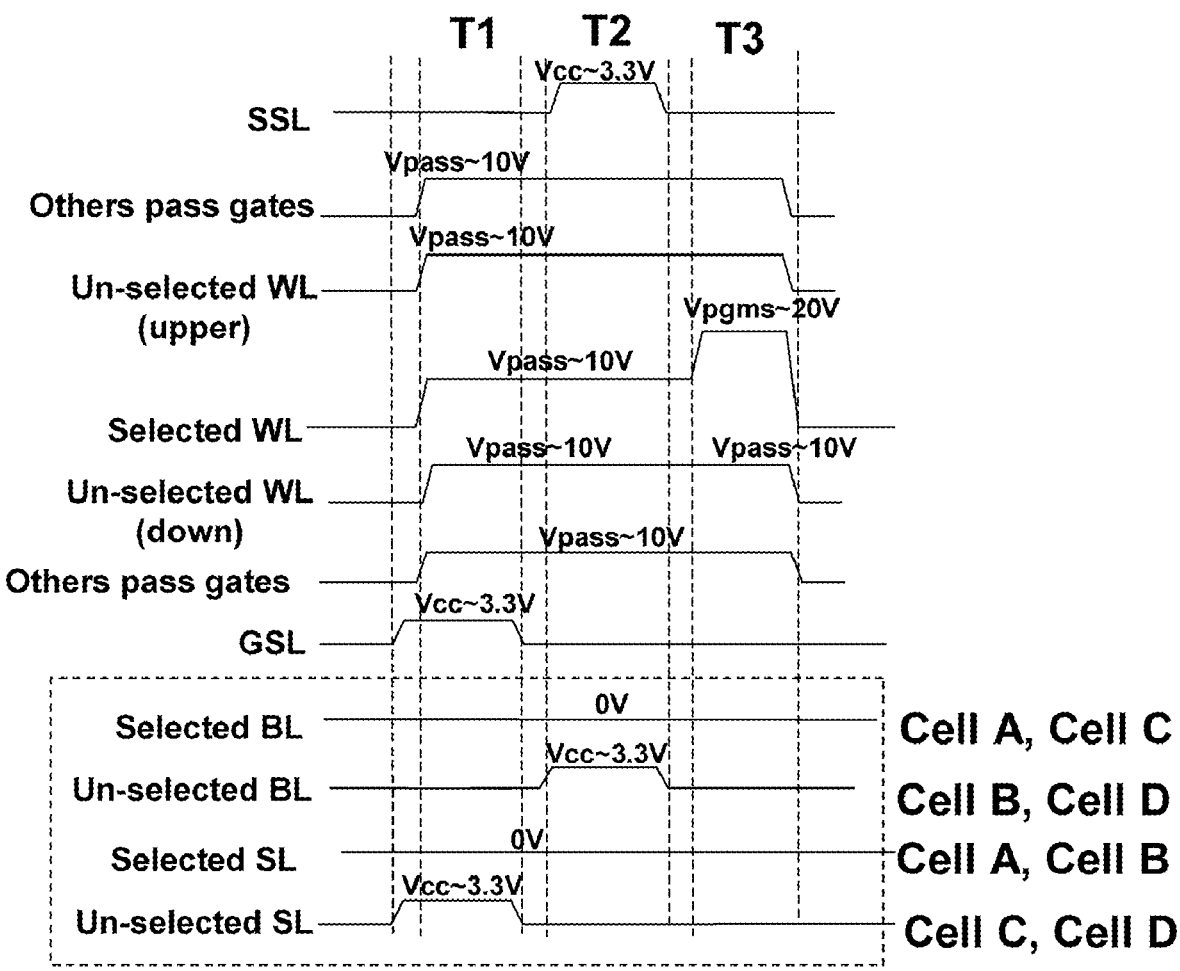
FIG. 24 shows a proposed waveform for decoding in one embodiment.

FIG. 23 is a three dimensional view of a memory device in one embodiment. The conductivity types of the elements of the memory device of FIG. 23 are similar with the conductivity types of the elements of the memory device of FIG. 20, except that the bit lines 502 have P+ type conductivity in FIG. 23. The bit line 502 and the channel line 512 (or the channel line 514) (N type conductivity) form a PN diode. In one embodiment, a positive bias voltage (such as +3.3V) is applied to the string selection lines 504. A bias voltage $V_{PGM}$ or $V_{READ}$ is applied to the word lines 506. A bias voltage VPASS is applied to the word lines 508. A zero voltage is applied to the ground selection lines 510 for PGM. A bias voltage $V_{cc}$ is applied to the ground selection lines 510 for read. In one embodiment, during reading, the source element 516 below the channel line 512 is applied a zero voltage or grounded. The source element 518 below, for example, the unselected channel line 514 to be turned off is floating or applied a positive bias voltage (such as $+V_{cc}$). Since the diode formed by the bit line 502 and the channel line 512 (or the channel line 514) does not allow reverse current, the unselected source element 518 would not be read. FIG. 24 shows a proposed waveform for decoding in some embodiments. Referring to FIG. 24, during T1 period, source line self-boosting is performed by a Vcc on the GSL and unselected SL. Vch is boosted for Cell C and D. During T2 period, bit-line self-boosting is performed by a Vcc on the SSL and unselected BL. Vch is boosted for Cell B. The boosted Vch of Cell C does not leak out due to the PN diode at BL. During T3 period, programming Cell A is started. The inversion channel is already formed during T1 and T2 periods and it can be programmed even SSL/GSL is turned-off. In addition, Cell E is the Vpass disturb, which is not a serious concern if Vpass<10V.

Figure 25:
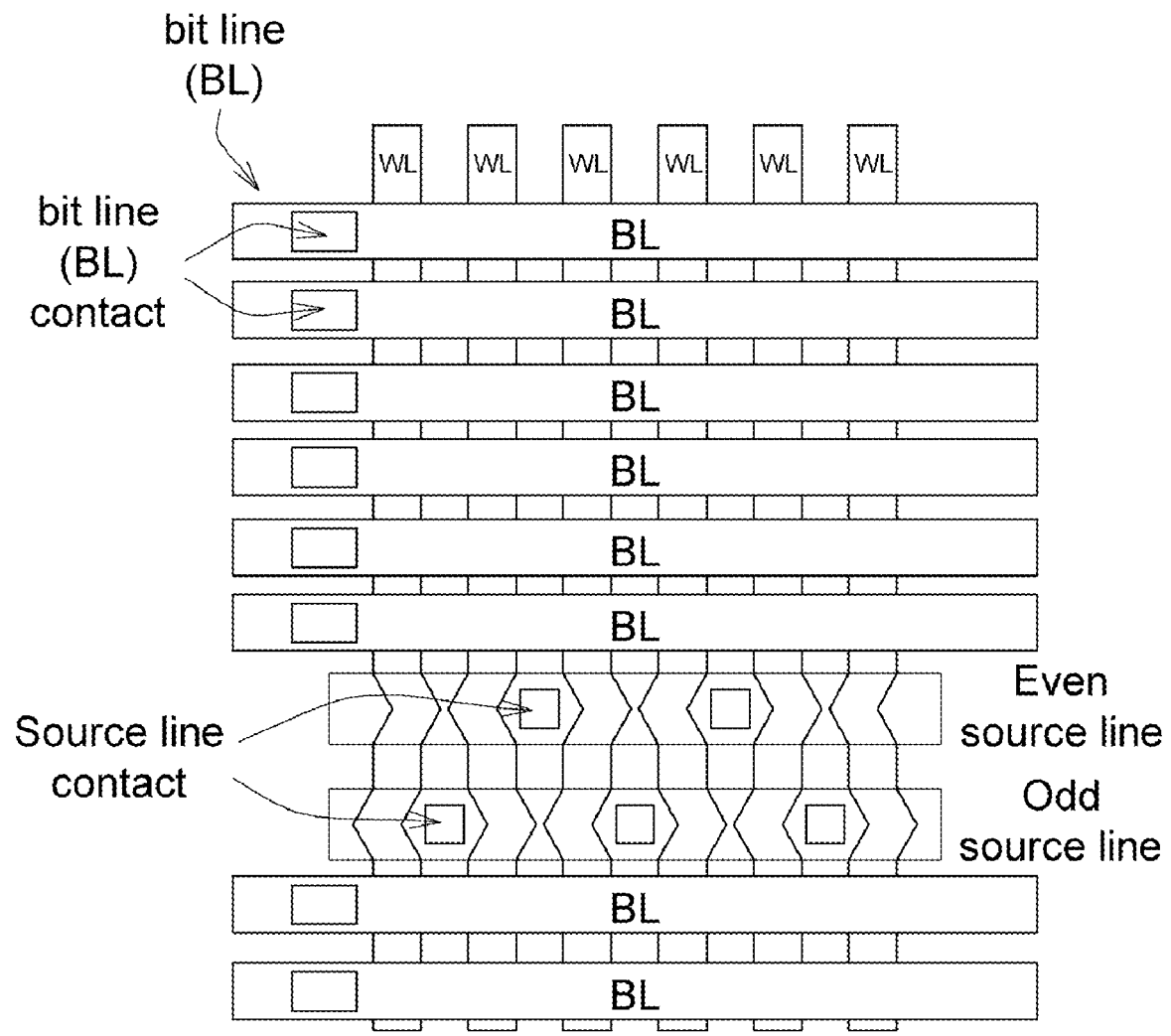
FIG. 25 shows a layout of a memory device in one embodiment.

FIG. 25 shows a layout of a memory device in one embodiment. The bottom diffusion source lines must be connected to metal source line periodically to reduce the source resistance. It can be fan-out like the proposed layout. Optionally, source lines can be separated in even/odd pairs, which also allows flexible selectivity for the array. The source line contact can facilitate the sidewall ONONO for self-aligned contact (SAC). The diffusion bit lines are connected to metal bit lines periodically to reduce the resistance. WL's of each layer can be shared or grouped into even/odd, and connect to WL decoder. The top SSL gates are connected to the SSL decoder.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a substrate;
   a plurality of stacked structures disposed on the substrate, wherein each of the stacked structures comprises a string selection line, a word line, a ground selection line and an insulating line, the string selection line, the word line and the ground selection line are separated from each other by the insulating line;
   a channel element disposed between the stacked structures;
   a dielectric element disposed between the channel element and the stacked structure;
   a source element disposed between an upper surface of a substrate and the lower surface of the channel element; and
   a bit line disposed on the upper surface of the channel element.

2. The memory device according to claim 1, wherein the source element and the substrate are separated from each other by the dielectric element, the substrate is used as a bottom gate.

3. The memory device according to claim 1, wherein the string selection line, the word line and the ground selection line have a first type conductivity, the source element, the channel element and the bit line have a second type conductivity opposite to the first type conductivity, the channel element has a dopant concentration smaller than dopant concentrations that the source element and the bit line have.

4. The memory device according to claim 1, wherein the bit line, the string selection line, the word line and the ground selection line have a first type conductivity, the source element and the channel element have a second type conductivity opposite to the first type conductivity, the channel element has a dopant concentration smaller than a dopant concentration that the source element has.

5. The memory device according to claim 1, wherein the bit line has a first type conductivity, the channel element has a second type conductivity opposite to the first type conductivity.

6. The memory device according to claim 1, wherein the channel element and the bit line form a PN diode.

7. The memory device according to claim 1, wherein the source element comprises a source layer covering the substrate.

8. The memory device according to claim 1, wherein the channel element comprises a plurality of channel lines, the source element comprises a plurality of source lines,
   one of the source lines below the channel lines on the same sidewall of the stacked structure is continuously extended;
   the source lines below the channel lines on the opposite sidewalls of the stacked structure are separated from each other.

9. The memory device according to claim 1, wherein the channel element comprises a plurality of channel lines, the source element comprises a plurality of source lines, the channel line has a long side perpendicular to a long side that the source line has.

10. A method for manufacturing a memory device, comprising:
    disposing a plurality of stacked structures on a substrate, wherein each of the stacked structures comprises a string selection line, a word line, a ground selection line and an insulating line, the string selection line, the word line and the ground selection line are separated from each other by the insulating line;

disposing a channel element between the stacked structures;

disposing a dielectric element between the channel element and the stacked structure;

disposing a source element between an upper surface of the substrate and a lower surface of the channel element; and disposing a bit line on the upper surface of the channel element.

11. The method for manufacturing the memory device according to claim 10, wherein the stacked structures has a space therebetween, the source element comprises a source line, the method for manufacturing the memory device comprises:

forming a dielectric element on the substrate and the stacked structures exposed by the space;

forming a conductive material for filling the space; and removing a portion of the conductive material for forming the source line and the channel element, wherein the source line and the channel element are disposed in the space, the source line and the substrate are separated from each other by the dielectric element.

12. The method for manufacturing the memory device according to claim 11, wherein the conductive material is extended on the stacked structure, the bit line is formed by a method comprising:

doping a portion of the conductive material extended on the stacked structure; and removing a portion of the doped conductive material for forming the bit line.

13. The method for manufacturing the memory device according to claim 10, wherein the source element comprises a source layer covering the substrate, the method for manufacturing the memory device comprises:

alternately stacking a plurality of sacrificial layers and a plurality of insulating layers;

forming a first opening in the alternately-stacked sacrificial layers and insulating layers;

forming the channel element by an epitaxial growth on the source layer exposed by the first opening;

forming a second opening in the alternately-stacked sacrificial layers and insulating layers;

removing the sacrificial layer exposed by the second opening for forming a slit exposing the channel element;

forming the dielectric element exposed by the slit; and forming a conductive material filling in the slit for forming the string selection line, the word line and the ground selection line.

14. The method for manufacturing the memory device according to claim 13, wherein the source layer and the channel element are composed of a single crystal material, and the channel element is formed by an epitaxial growth.

15. The method for manufacturing the memory device according to claim 13, wherein the source layer is a single crystal silicon, the insulating line is an oxide, the sacrificial layer is a silicon nitride, the second opening exposes the source layer and the insulating line, the sacrificial layer exposed by the second opening is removed by a method using a hot H3PO4.

16. A method for operating a memory device, comprising:
providing a memory device comprising:
a substrate;
a plurality of stacked structures disposed on the substrate, wherein each of the stacked structures comprises a string selection line, a word line, a ground selection line and an insulating line, the string selection line, the word line and the ground selection line are separated from each other by the insulating line;

a channel element comprising a plurality of channel lines, the channel lines are disposed between the stacked structures and separated from each other;

a dielectric element disposed between the channel lines and the stacked structures;

a source element disposed between an upper surface of the substrate and a lower surface of the channel lines; and a bit line disposed on a upper surface of the channel element; and selecting at least one of the channel lines to be turned on.

17. The method for operating the memory device according to claim 16, wherein the string selection line, the word line and the ground selection line have a first type conductivity, the source element, the channel element and the bit line have a second type conductivity opposite to the first type conductivity, the channel line is turned on by a method comprising:

applying a first bias voltage to the string selection lines of the stacked structures on the two opposite sidewalls of the selected channel line.

18. The method for operating the memory device according to claim 17, further comprising applying a second bias voltage to the string selection line of the stacked structure on one sidewall of the channel line not selected and to be turned off, wherein the turned off channel line and the turned-on channel line have the common string selection line that the first bias voltage applied to, the first bias voltage is opposite to the second bias voltage.

19. The method for operating the memory device according to claim 18, wherein the first type conductivity is P type conductivity, the second type conductivity is N type conductivity, the first bias voltage is a positive bias voltage, and the second bias voltage is a negative bias voltage.

20. The method for operating the memory device according to claim 17, further comprising applying a second bias voltage to the string selection lines of the stacked structures on the opposite sidewalls of the channel line not selected and to be turned off.

21. The method for operating the memory device according to claim 20, wherein the first bias voltage and the second bias voltage are respectively applied to a portion adjacent to the channel line to be turned on and a portion adjacent to the channel line to be turned off of the single string selection line.

22. The method for operating the memory device according to claim 16, further comprising applying a third bias voltage and a fourth bias voltage different from each other to the word lines of the stacked structures on the two opposite sidewalls of the channel line.

23. The method for operating the memory device according to claim 22, wherein the third bias voltage is $V_{PGM}$ or $V_{READ}$, the fourth bias voltage is zero.

24. The method for operating the memory device according to claim 16, wherein the bit line, the string selection line, the word line and the ground selection line have a first type conductivity, the source element and the channel lines have a second type conductivity, the selected channel line is turned on by a method comprising:

applying a zero voltage or grounding the source element below the selected channel line.

25. The method for operating the memory device according to claim 16, further comprising floating and applying a fifth bias voltage to the source element below the channel line unselected and to be turned off.

26. The method for operating the memory device according to claim 25, wherein the first type conductivity is P type conductivity, the second type conductivity is N type conductivity, the fifth bias voltage is a positive bias voltage.

* * * * *